US011183386B2

(12) United States Patent
Terashima et al.

(10) Patent No.: US 11,183,386 B2
(45) Date of Patent: Nov. 23, 2021

(54) SEMICONDUCTOR DEVICE AND METHOD OF MANUFACTURING SAME

(71) Applicant: Mitsubishi Electric Corporation, Tokyo (JP)

(72) Inventors: Tomohide Terashima, Tokyo (JP); Yasuhiro Kagawa, Tokyo (JP); Kensuke Taguchi, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 16/587,197

(22) Filed: Sep. 30, 2019

(65) Prior Publication Data
US 2020/0203166 A1    Jun. 25, 2020

(30) Foreign Application Priority Data

Dec. 21, 2018  (JP) .............................. JP2018-239386

(51) Int. Cl.
| | |
|---|---|
| *H01L 21/22* | (2006.01) |
| *H01L 29/10* | (2006.01) |
| *H01L 29/16* | (2006.01) |
| *H01L 29/32* | (2006.01) |
| *H01L 29/78* | (2006.01) |
| *H01L 29/66* | (2006.01) |
| *H01L 29/739* | (2006.01) |

(52) U.S. Cl.
CPC ........ *H01L 21/221* (2013.01); *H01L 29/1095* (2013.01); *H01L 29/1608* (2013.01); *H01L 29/32* (2013.01); *H01L 29/66068* (2013.01); *H01L 29/7395* (2013.01); *H01L 29/7804* (2013.01); *H01L 29/7815* (2013.01)

(58) Field of Classification Search
CPC .............. H01L 21/221; H01L 29/1095; H01L 29/66068; H01L 29/7815; H01L 29/7395; H01L 29/66712; H01L 29/7827; H01L 29/7804
See application file for complete search history.

(56) References Cited

U.S. PATENT DOCUMENTS

| | | | | | |
|---|---|---|---|---|---|
| 4,896,196 | A | * | 1/1990 | Blanchard | ........... H01L 29/1095 257/139 |
| 5,049,961 | A | * | 9/1991 | Zommer | ............. H01L 27/0248 257/470 |
| 5,442,216 | A | * | 8/1995 | Gough | ................ H01L 27/0251 257/355 |

(Continued)

FOREIGN PATENT DOCUMENTS

JP        H08-316471 A        11/1996

*Primary Examiner* — Errol V Fernandes
*Assistant Examiner* — Jeremy J Joy
(74) *Attorney, Agent, or Firm* — Studebaker & Brackett PC

(57) ABSTRACT

There is provided a technique for suppressing the operation of a parasitic transistor in a semiconductor device having a voltage sense structure. The semiconductor device includes: a semiconductor layer; a first impurity region; a second impurity region; a first semiconductor region; a second semiconductor region; a first electrode; a second electrode; and a third electrode. The second impurity region includes a low lifetime region at least under the second semiconductor region. The low lifetime region is a region having a defect density higher than that in a surface layer of the second impurity region or a region in which a heavy metal is diffused.

13 Claims, 6 Drawing Sheets

(56) References Cited

U.S. PATENT DOCUMENTS

| | | | | |
|---|---|---|---|---|
| 5,736,769 | A * | 4/1998 | Nishiura | H01L 27/0248 257/140 |
| 6,538,289 | B1 * | 3/2003 | Topp | H01L 29/7395 257/360 |
| 2005/0133855 | A1 * | 6/2005 | Graf | H01L 29/7809 257/327 |
| 2005/0156267 | A1 * | 7/2005 | Mori | H01L 29/7804 257/467 |
| 2009/0230500 | A1 * | 9/2009 | Yoshikawa | H01L 27/0255 257/470 |
| 2014/0061644 | A1 * | 3/2014 | Cao | H01L 23/34 257/48 |
| 2014/0319540 | A1 * | 10/2014 | Sugimoto | H01L 29/0653 257/77 |
| 2017/0236908 | A1 * | 8/2017 | Naito | H01L 29/4238 257/48 |
| 2018/0233564 | A1 * | 8/2018 | Kumada | H01L 29/167 |
| 2018/0277437 | A1 * | 9/2018 | Yamada | H01L 29/1608 |
| 2019/0074352 | A1 * | 3/2019 | Pfirsch | H01L 29/1095 |
| 2019/0131443 | A1 * | 5/2019 | Hoshi | H01L 29/32 |
| 2019/0371932 | A1 * | 12/2019 | Hashizume | H01L 29/66068 |
| 2020/0144149 | A1 * | 5/2020 | Kubouchi | H01L 21/221 |

* cited by examiner

F I G. 5
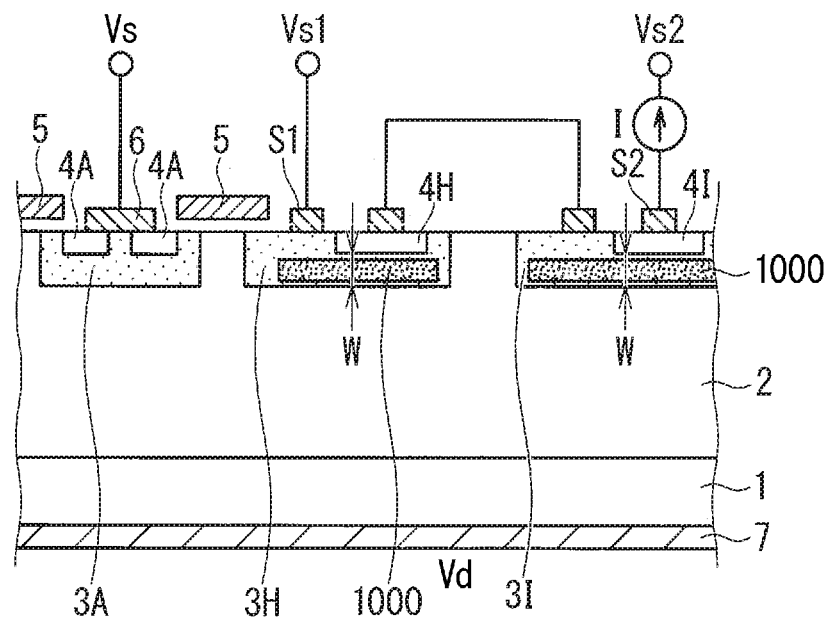
F I G. 6
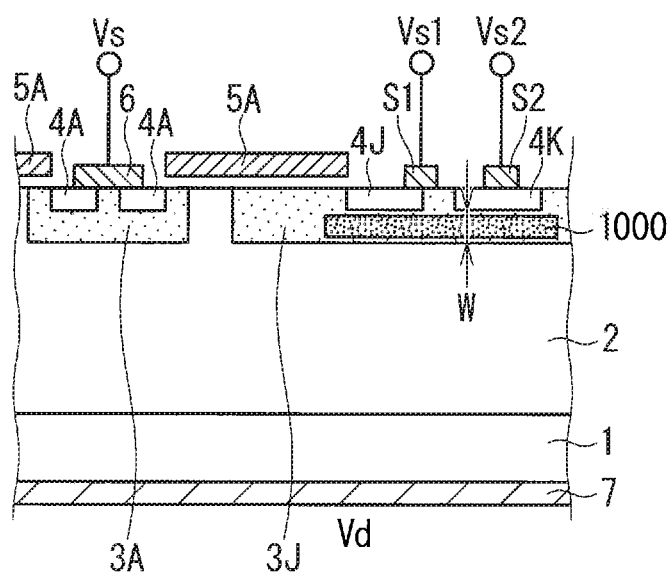

SEMICONDUCTOR DEVICE AND METHOD OF MANUFACTURING SAME

BACKGROUND

Field

The present disclosure relates to a semiconductor device and a method of manufacturing the same.

Description of the Background Art

A semiconductor device having a voltage sense structure which measures a forward bias voltage V of a pn junction has hitherto been provided. The voltage sense structure of the semiconductor device is configured, for example, such that a p type impurity region is formed in the surface layer of an n type semiconductor layer, and an n type semiconductor region is further formed in the surface layer of the p type impurity region.

Sense electrodes are connected to respective upper surfaces of the p type impurity region and the n type semiconductor region, as disclosed in Japanese Patent Application Laid-Open No. 8-316471 (1996), for example.

The n type semiconductor layer, the p type impurity region, and the n type semiconductor region form a vertical parasitic NPN transistor in the aforementioned structure. A constant current flowing between the sense electrodes serves as a base current of the parasitic NPN transistor. For this reason, an electron flow from the n type semiconductor region reaches a drain electrode.

An increase in current of the parasitic NPN transistor not only reduces the accuracy of measurement of temperature and the like based on sense potentials but also results in a likelihood that the semiconductor device is thermally damaged.

SUMMARY

It is therefore an object of the present disclosure to provide a technique for suppressing the operation of a parasitic transistor in a semiconductor device having a voltage sense structure.

According to a first aspect of the present disclosure, a semiconductor device comprises: a semiconductor layer of a first conductivity type; a first impurity region of a second conductivity type partially formed in a surface layer of the semiconductor layer; at least one second impurity region of the second conductivity type partially formed in the surface layer of the semiconductor layer and spaced apart from the first impurity region; a first semiconductor region of the first conductivity type partially formed in a surface layer of the first impurity region; a second semiconductor region of the first conductivity type partially formed in a surface layer of the second impurity region; a first electrode formed in contact with an upper surface of the first impurity region and an upper surface of the first semiconductor region; a second electrode formed in contact with an upper surface of the second impurity region; a third electrode formed in contact with an upper surface of the second semiconductor region; and a gate electrode provided on the upper surface of the first impurity region lying between the semiconductor layer and the first semiconductor region, with an insulation film therebetween, the second impurity region including a low lifetime region at least under the second semiconductor region, the low lifetime region being a region having a defect density higher than that in the surface layer of the second impurity region or a region in which a heavy metal is diffused.

According to a second aspect of the present disclosure, a method of manufacturing a semiconductor device comprises the steps of: partially forming a first impurity region of a second conductivity type in a surface layer of a semiconductor layer of a first conductivity type; partially forming a second impurity region of the second conductivity type in the surface layer of the semiconductor layer so as to be positioned in spaced apart relation to the first impurity region; applying electron beam irradiation, proton irradiation, or helium irradiation to at least a bottom portion of the second impurity region or diffusing a heavy metal therein to form a low lifetime region, the low lifetime region being a region having a defect density higher than that in a surface layer of the second impurity region or a region in which the heavy metal is diffused; partially forming a first semiconductor region of the first conductivity type in a surface layer of the first impurity region; partially forming a second semiconductor region of the first conductivity type in the surface layer of the second impurity region; forming a first electrode in contact with an upper surface of the first impurity region and an upper surface of the first semiconductor region; forming a second electrode in contact with an upper surface of the second impurity region; forming a third electrode in contact with an upper surface of the second semiconductor region; and forming a gate electrode on the upper surface of the first impurity region lying between the semiconductor layer and the first semiconductor region, with an insulation film therebetween.

The first aspect of the present disclosure is capable of suppressing the operation of a parasitic transistor to thereby suppress the decrease in the accuracy of measurement of temperature and the like based on sense potentials.

The second aspect of the present disclosure is capable of forming the low lifetime region in the bottom portion of the second impurity region. This suppresses the operation of a parasitic transistor to thereby suppress the decrease in the accuracy of measurement of temperature and the like based on sense potentials.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIGS. 1 to 6 are schematic sectional views of configurations of a semiconductor device according to preferred embodiments;

DESCRIPTION OF THE PREFERRED EMBODIMENTS

Figure 1:
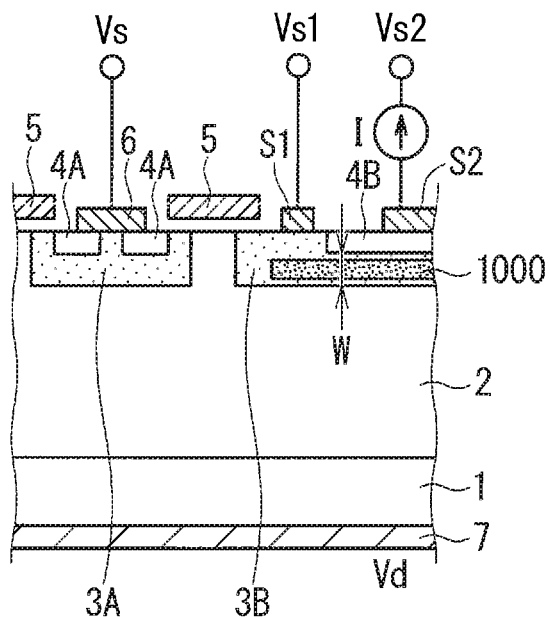

Preferred embodiments will now be described with reference to the accompanying drawings. Examples of effects produced by the respective preferred embodiments will be summarized after all of the preferred embodiments are described.

In the drawings, figures show schematic representations, and components are shown in simplified form or not shown, as appropriate, for convenience of illustration. The sizes and positions of components shown in different figures are not necessarily in a correct correlation, but may be changed, as appropriate. In a figure that is a plan view rather than a sectional view, components are in some cases hatched or shaded for the purpose of facilitating the understanding of the details of the preferred embodiments.

In the following description, similar components are designated by and shown using the same reference numerals and characters, and shall have similar designations and functions. Thus, these components will not be described in detail in some cases for the purpose of avoiding repetition in description.

Terms referring to specific positions and directions such as "upper", "lower", "left", "right", "side", "bottom", "front", and "back" in the following description, if any, shall be used for the sake of convenience and for the purpose of facilitating the understanding of the details of the preferred embodiments, and shall not be related to directions used when the preferred embodiments are actually practiced.

The term "upper surface of" or "lower surface of" a first component used in the following description is to be interpreted as including a situation in which a second component is formed on the upper or lower surface of the first component in addition to meaning the upper or lower surface itself of the first component. That is, the expression "a first component provided on an upper surface of a second component" used as an example shall not preclude the presence of a third component interposed between the first and second components.

In the case where ordinal numerals such as "first" and "second" are used in the following description, these terms shall be used for the sake of convenience and for the purpose of facilitating the understanding of the details of the preferred embodiments, and shall not be limited to the order caused by the ordinal numerals.

First Preferred Embodiment

Description will be given on a semiconductor device according to a first preferred embodiment and a method of manufacturing the same. For purposes of discussion, a configuration of a semiconductor device related to the present preferred embodiment will be described.

Figure 10:
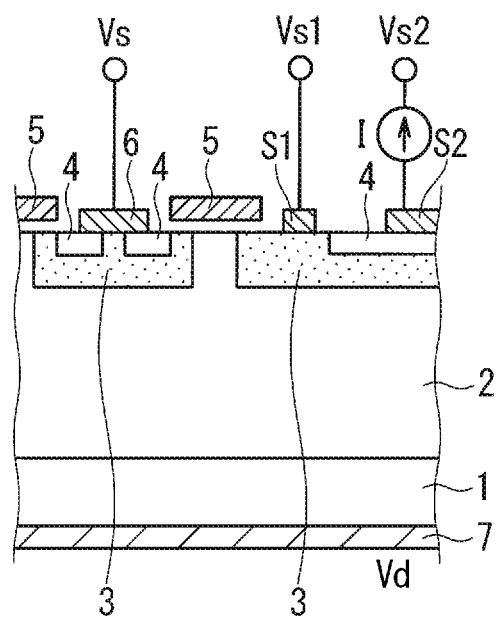
FIG. 10 is a schematic sectional view of a configuration of a semiconductor device related to the preferred embodiments.

FIG. 10 is a schematic sectional view of a configuration of a semiconductor device related to the present preferred embodiment.

As shown in FIG. 10 as an example, the semiconductor device includes: an $n^+$ type semiconductor substrate 1; an $n^-$ type semiconductor layer 2 formed on an upper surface of the $n^+$ type semiconductor substrate 1; a plurality of p type impurity regions 3 formed in the surface layer of the $n^-$ type semiconductor layer 2; $n^+$ type semiconductor regions 4 partially formed in the surface layer of the p type impurity regions 3; a gate electrode 5 in contact with an upper surface of the p type impurity regions 3 lying between the $n^-$ type semiconductor layer 2 and the $n^+$ type semiconductor regions 4, with an oxide film (not shown in FIG. 10) therebetween; a source electrode 6 formed in contact with the upper surface of the p type impurity regions 3 and an upper surface of the $n^+$ type semiconductor regions 4; and a drain electrode 7 formed in contact with a lower surface of the $n^+$ type semiconductor substrate 1.

An electrode formed in contact with the upper surface of one of the p type impurity regions 3 spaced apart from the other p type impurity region 3 in contact with the source electrode 6 is a sense electrode S1, and an electrode formed in contact with the upper surface of one of the $n^+$ type semiconductor regions 4 which is formed in the surface layer of the one p type impurity region 3 is a sense electrode S2.

The potential of the drain electrode 7 is a potential Vd, and the potential of the source electrode 6 is a potential Vs. The potential of the sense electrode S1 is a sense potential Vs1, and the potential of the sense electrode S2 is a sense potential Vs2.

The gate electrode 5 is in contact with the upper surface of the p type impurity regions 3 lying between the $n^-$ type semiconductor layer 2 and the $n^+$ type semiconductor regions 4, with the oxide film (not shown in FIG. 10) therebetween, whereby a metal-oxide-semiconductor field-effect transistor (MOSFET) is formed.

Also, diodes including the sense electrode S1 and the sense electrode S2 are formed. When a constant current is passed through these diodes in a forward bias direction, a forward bias voltage V is developed between the sense potential Vs2 and the sense potential Vs1. Typically, temperature measurement is made by detecting the forward bias voltage V.

In an example of actual use, a short circuit is caused between the sense electrode S1 and the source electrode 6 to measure the sense potential Vs1 minus the sense potential Vs2, that is, the potential Vs minus the sense potential Vs2.

A relationship between a forward bias current I and the forward bias voltage V of a pn junction is substantially expressed by:

$$\ln(I) \propto q(V/n-Ve)/kT + A \quad (1)$$

where Ve is a band gap voltage, n is a bipolar coefficient, and A is a constant.

When the forward bias current I is constant, dV/dT is a constant negative value because the band gap voltage Ve>V/n. This allows the detection of a temperature T, based on the sense potential Vs2 minus the sense potential Vs1, for example.

Figure 11:
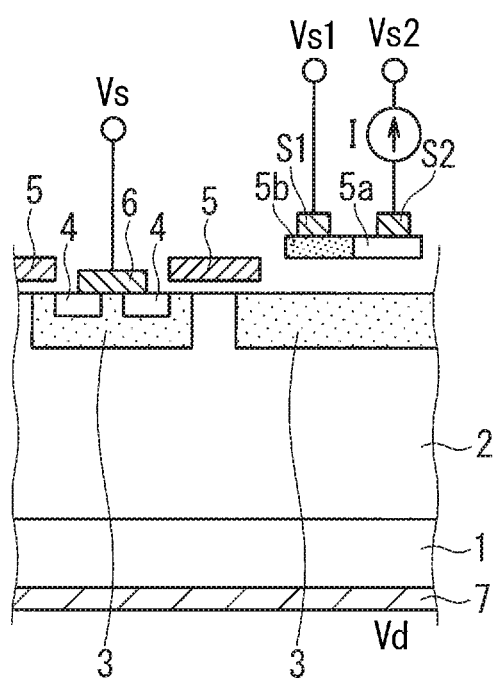
FIG. 11 is a schematic sectional view of another configuration of the semiconductor device related to the preferred embodiments.

FIG. 11 is a schematic sectional view of another configuration of the semiconductor device related to the present preferred embodiment.

As shown in FIG. 11 as an example, the semiconductor device includes the $n^+$ type semiconductor substrate 1, the $n^-$ type semiconductor layer 2, the plurality of p type impurity regions 3, the $n^+$ type semiconductor regions 4, the gate electrode 5, the source electrode 6, and the drain electrode 7.

P type polysilicon 5b is formed on the upper surface of one of the p type impurity regions 3 spaced apart from the other p type impurity region 3 in contact with the source electrode 6, with an oxide film (not shown in FIG. 11) having a thickness in the range of 0.5 to 1 µm therebetween. The sense electrode S1 is formed in contact with an upper surface of the p type polysilicon 5b.

N type polysilicon 5a is also formed on the upper surface of the one p type impurity region 3 spaced apart from the other p type impurity region 3 in contact with the source electrode 6, with an oxide film (not shown in FIG. 11) having a thickness in the range of 0.5 to 1 µm therebetween. The sense electrode S2 is formed in contact with an upper surface of the n type polysilicon 5a.

The potential of the drain electrode 7 is the potential Vd, and the potential of the source electrode 6 is the potential Vs. The potential of the sense electrode S1 is the sense potential Vs1, and the potential of the sense electrode S2 is the sense potential Vs2.

In such a configuration, it is also assumed that the forward bias voltage V of a pn junction is used.

In the structure shown in FIG. 10 as an example, the n⁻ type semiconductor layer 2, the p type impurity regions 3, and the n⁺ type semiconductor regions 4 form a vertical parasitic NPN transistor. Thus, a constant current passed from the sense electrode S1 toward the sense electrode S2 serves as a base current of the parasitic NPN transistor. As a result, an electron flow from the n⁺ type semiconductor regions 4 reaches the drain electrode 7.

An increase in current of the parasitic NPN transistor not only changes the sense potential Vs1 minus the sense potential Vs2 from a value conforming to Expression (1) to reduce the accuracy of measurement of the temperature T and the like but also results in a likelihood that the semiconductor device is thermally damaged.

If the potential Vd is changed with a large value of dV/dt in response to the operation of the MOSFET, a displacement current flows in the p type impurity regions 3. Then, the sense potential Vs1 minus the sense potential Vs2 is fluctuated by the internal resistance of the p type impurity regions 3. This phenomenon also becomes a factor in changing the sense potential Vs1 minus the sense potential Vs2 from a value conforming to Expression (1).

Further, if the potential Vd is negatively biased, a hole current flows in the p type impurity regions 3. This phenomenon also becomes a factor in changing the sense potential Vs1 minus the sense potential Vs2 from a value conforming to Expression (1).

The structure shown in FIG. 11 as an example does not cause these problems but gives rise to apprehension that the addition of a process for the formation of a polysilicon pn junction results in an increase in manufacturing costs.

If voltage sense is used for temperature measurement by forming n type polysilicon and p type polysilicon on an upper surface of an oxide film having a thermal resistance that is approximately 100 times that of silicon, the problem of a time delay with respect to an actual temperature change arises.

Configuration of Semiconductor Device

FIG. 1 is a schematic sectional view of a configuration of a semiconductor device according to the present preferred embodiment.

As shown in FIG. 1 as an example, the semiconductor device includes: the n⁺ type semiconductor substrate 1; the n⁻ type semiconductor layer 2; a p type impurity region 3A partially formed in the surface layer of the n⁻ type semiconductor layer 2; a p type impurity region 3B partially formed in the surface layer of the n⁻ type semiconductor layer 2 and spaced apart from the p type impurity region 3A; a plurality of n⁺ type semiconductor regions 4A formed in the surface layer of the p type impurity region 3A; an n⁺ type semiconductor region 4B partially formed in the surface layer of the p type impurity region 3B; the gate electrode 5 in contact with an upper surface of the p type impurity region 3A lying between the n⁻ type semiconductor layer 2 and the n⁺ type semiconductor regions 4A, with an oxide film (not shown in FIG. 1) therebetween; the source electrode 6 formed in contact with the upper surface of the p type impurity region 3A and an upper surface of the n⁺ type semiconductor regions 4A; and the drain electrode 7.

An electrode formed in contact with an upper surface of the p type impurity region 3B is the sense electrode S1, and an electrode formed in contact with an upper surface of the n⁺ type semiconductor region 4B is the sense electrode S2.

The potential of the drain electrode 7 is the potential Vd, and the potential of the source electrode 6 is the potential Vs. The potential of the sense electrode S1 is the sense potential Vs1, and the potential of the sense electrode S2 is the sense potential Vs2.

In a parasitic NPN transistor comprised of the n⁻ type semiconductor layer 2, the p type impurity region 3B, and the n⁺ type semiconductor region 4B, the lifetime of electrons in the p type impurity region 3B serving as a base region of the parasitic NPN transistor is sufficiently lowered, whereby the parasitic NPN transistor is rendered substantially inoperative.

A specific manufacturing method includes applying electron beam irradiation, proton irradiation, helium irradiation, or the like to a voltage sense structure including the p type impurity region 3B to form defects in the p type impurity region 3B immediately under the n⁺ type semiconductor region 4B. This region is referred to as a defect region 1000. Specifically, the defect region 1000 having a crystal defect density higher than that of its surroundings (at least higher than that in the surface layer of the p type impurity region 3B) is formed at least in the p type impurity region 3B immediately under the n⁺ type semiconductor region 4B. This provides a method which lowers the lifetime of electrons in the p type impurity region 3B and especially in the defect region 1000.

A region in which the defect region 1000 is formed is not limited to the area shown as an example in FIG. 1.

As mentioned above, the defect region 1000 is a region (low lifetime region) for lowering the lifetime of electrons. A region in which a heavy metal such as gold or platinum is diffused may be formed as the low lifetime region, so long as the region is able to lower the lifetime of electrons.

The defect region 1000 is described above as the region for lowering the lifetime of "electrons". In a p-channel MOSFET of opposite polarity, however, the defect region 1000 functions as a region for lowering the lifetime of "holes".

In a semiconductor device employing silicon carbide (SiC), the p type impurity region 3B may be formed by ion implantation, whereby the defect region 1000 is formed in the p type impurity region 3B to lower the lifetime of electrons.

The ratio of the current flowing out from the p type impurity region 3B into the n⁻ type semiconductor layer 2 to the forward bias current in the pn junction between the n⁺ type semiconductor region 4B and the p type impurity region 3B corresponds to the collector current/emitter current (Ic/Ie) of the parasitic NPN transistor. However, Expression (1) described above holds when Ic≈0 because Expression (1) is premised on a diode operation.

This is the same in meaning as the following: an electron concentration resulting from the electrons injected into the p type impurity region 3B decreases exponentially and becomes nearly zero when a distance W is traveled, where W is the thickness of the p type impurity region 3B immediately under the n⁺ type semiconductor region 4B, that is, the thickness of the defect region 1000.

If the distance W is as short as the diffusion length of the electrons, a linear function in which the electron concentration decreases linearly for the distance W is provided, and the relationship in Expression (1) described above is changed. In general, the accuracy of measurement of voltage sense is required to be on the order of percent. It is hence necessary that Ic/Ie≤¹⁄₁₀₀₀ in the parasitic NPN transistor.

The ratio of the current flowing out from the p type impurity region 3B into the n⁻ type semiconductor layer 2 to the electron flow injected into the p type impurity region 3B is substantially expressed by:

$$\exp(-W/\sqrt{D_n \tau_n}) \quad (2)$$

where $D_n$, is the diffusion coefficient of electrons in the p type impurity region 3B, and $\tau_n$ is the lifetime of the electrons in the p type impurity region 3B.

If the value given by Expression (2) is not greater than ¹⁄₁₀₀₀, Ic/Ie≤¹⁄₁₀₀₀ is satisfied because Ie is the sum of the electron flow injected into the p type impurity region 3B and the hole flow injected into the n⁺ type semiconductor region 4B.

Also, because $\exp(-7) \approx 1/1000$, this condition is expressed substantially by:

$$W \geq 7\sqrt{D_n \tau_n} \quad (3)$$

This is equivalent to ensuring the distance W that is not less than seven times the diffusion length of the electrons.

The measurement of the sense potential Vs1 with respect to the sense potential Vs2 is directly influenced by the displacement current flowing in the pn junction between the p type impurity region 3B and the n⁻ type semiconductor layer 2. It is hence desirable that a short circuit is caused between the sense potential Vs1 and the potential Vs, and the potential Vs minus the sense potential Vs2 is measured.

Second Preferred Embodiment

The semiconductor device according to a second preferred embodiment will be described. In the following description, components similar to those described in the aforementioned first preferred embodiment are designated by and shown using the same reference numerals and characters, and will not be described in detail, as appropriate.

Configuration of Semiconductor Device

In the first preferred embodiment, it has been described that a short circuit is caused between the sense potential Vs1 and the potential Vs and the potential Vs minus the sense potential Vs2 is measured, whereby the influence of the displacement current flowing in the p type impurity regions is reduced. The second preferred embodiment is also intended to suppress the displacement of the current flowing in the p type impurity region.

Figure 2:
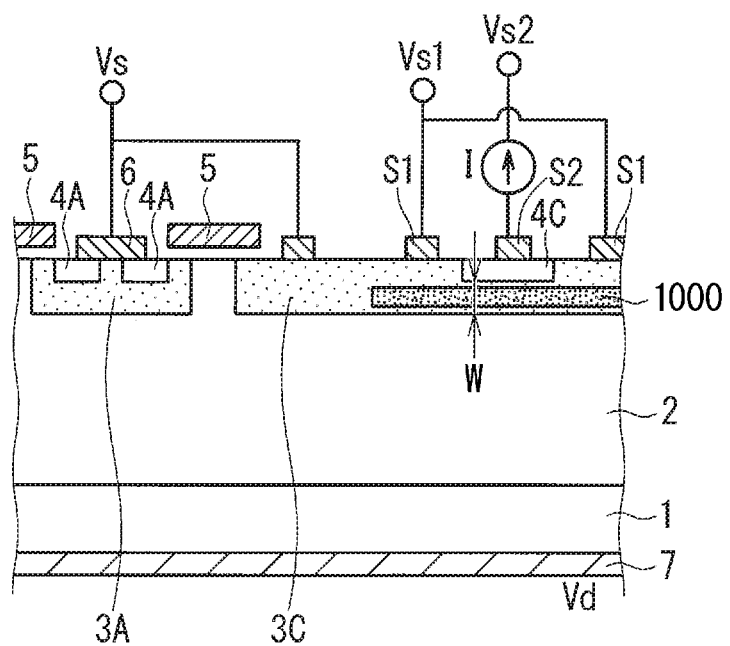

FIG. 2 is a schematic sectional view of a configuration of the semiconductor device according to the present preferred embodiment.

As shown in FIG. 2 as an example, the semiconductor device includes: the n⁺ type semiconductor substrate 1; the n⁻ type semiconductor layer 2; the p type impurity region 3A; a p type impurity region 3C partially formed in the surface layer of the n⁻ type semiconductor layer 2 and having the defect region 1000; the plurality of n⁺ type semiconductor regions 4A; an n⁺ type semiconductor region 4C partially formed in the surface layer of the p type impurity region 3C; the gate electrode 5; the source electrode 6 formed in contact with the upper surface of the p type impurity region 3A and the upper surface of the n⁺ type semiconductor regions 4A; and the drain electrode 7.

An electrode formed in contact with a plurality of locations (two locations as seen in FIG. 2) of an upper surface of the p type impurity region 3C is the sense electrode S1, and an electrode formed in contact with an upper surface of the n⁺ type semiconductor region 4C is the sense electrode S2.

The potential of the drain electrode 7 is the potential Vd, and the potential of the source electrode 6 is the potential Vs. The potential of the sense electrode S1 is the sense potential Vs1, and the potential of the sense electrode S2 is the sense potential Vs2.

In the semiconductor device according to the present preferred embodiment, part of a structure including the p type impurity region 3C which is the voltage sense structure is short-circuited to the source electrode 6. The sense electrode S1 is provided in the vicinity of the n⁺ type semiconductor region 4C. Ideally, it is desirable that the sense electrode S1 is configured to surround the sense electrode S2 on the upper surface of the n⁺ type semiconductor region 4C as seen in plan view.

In the semiconductor device according to the present preferred embodiment, the displacement current flowing in the p type impurity region 3C in the voltage sense structure is all bypassed by the sense electrode S1. Thus, the sense potential Vs1 minus the potential Vs is influenced by the displacement current, but the influence upon the sense potential Vs1 minus the sense potential Vs2 is greatly reduced. The semiconductor device according to the present preferred embodiment is hence capable of greatly reducing the influence resulting from fluctuations in potential Vd.

Third Preferred Embodiment

The semiconductor device according to a third preferred embodiment will be described. In the following description, components similar to those described in the aforementioned preferred embodiments are designated by and shown using the same reference numerals and characters, and will not be described in detail, as appropriate.

Configuration of Semiconductor Device

Figure 3:
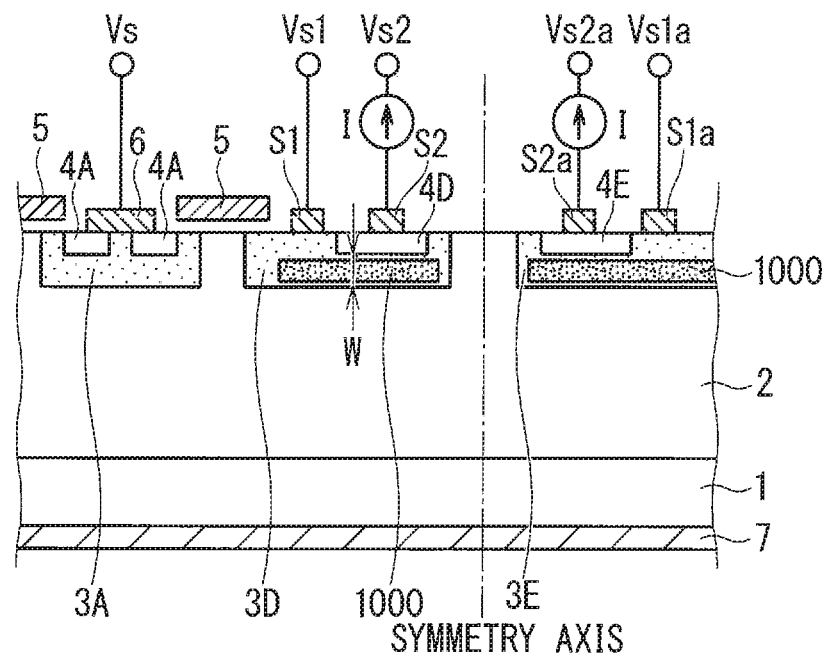

FIG. 3 is a schematic sectional view of a configuration of the semiconductor device according to the present preferred embodiment.

As shown in FIG. 3 as an example, the semiconductor device includes: the n⁺ type semiconductor substrate 1; the n⁻ type semiconductor layer 2; the p type impurity region 3A; a p type impurity region 3D partially formed in the surface layer of the n⁻ type semiconductor layer 2 and having the defect region 1000; a p type impurity region 3E partially formed in the surface layer of the n⁻ type semiconductor layer 2 and having another defect region 1000; the plurality of n⁺ type semiconductor regions 4A; an n⁺ type semiconductor region 4D partially formed in the surface layer of the p type impurity region 3D; an n⁺ type semiconductor region 4E partially formed in the surface layer of the p type impurity region 3E; the gate electrode 5; the source electrode 6; and the drain electrode 7.

An electrode formed in contact with an upper surface of the p type impurity region 3D is the sense electrode S1, and an electrode formed in contact with an upper surface of the n⁺ type semiconductor region 4D is the sense electrode S2.

An electrode formed in contact with an upper surface of the p type impurity region 3E is a sense electrode S1a, and an electrode formed in contact with an upper surface of the n⁺ type semiconductor region 4E is a sense electrode S2a.

The potential of the drain electrode 7 is the potential Vd, and the potential of the source electrode 6 is the potential Vs. The potential of the sense electrode S1 is the sense potential Vs1, and the potential of the sense electrode S2 is the sense potential Vs2. The potential of the sense electrode S1*a* is a sense potential Vs1*a*, and the potential of the sense electrode S2*a* is a sense potential Vs2*a*.

In the semiconductor device according to the present preferred embodiment, two voltage sense structures are formed, and are as symmetrical in shape to each other as possible. Ideally, it is desirable that the voltage sense structures are disposed in symmetric relation to each other on the entire semiconductor chip.

With reference to FIG. 3, the voltage sense structure including the p type impurity region 3D and the voltage sense structure including the p type impurity region 3E are disposed in axisymmetric relation to each other.

Because of such an arrangement of the voltage sense structures, displacement currents generated in the two respective voltage sense structures disposed in symmetric relation to each other substantially coincide with each other. A voltage developed by the displacement current flowing to the resistance of the p type impurity region 3D substantially coincides with a voltage developed by the displacement current flowing to the resistance of the p type impurity region 3E.

In this state is obtained the following relationship:

$$nkT/q \cdot \ln(Ia/I) \propto (Vs1a - Vs2a) - (Vs1 - Vs2) \qquad (4)$$

where Ia and I are the displacement currents in the two respective voltage sense structures, when the displacement currents Ia and I are set to different values.

The voltages resulting from the displacement currents are canceled out on the left-hand side of Expression (4). This greatly reduces the influence of fluctuations in potential Vd.

Also, the left-hand side of Expression (4) represents a current ratio. Thus, more precise voltage sense is achieved if the accuracy of the current ratio is higher than that of the current values.

Fourth Preferred Embodiment

The semiconductor device according to a fourth preferred embodiment will be described. In the following description, components similar to those described in the aforementioned preferred embodiments are designated by and shown using the same reference numerals and characters, and will not be described in detail, as appropriate.

Configuration of Semiconductor Device

Figure 4:
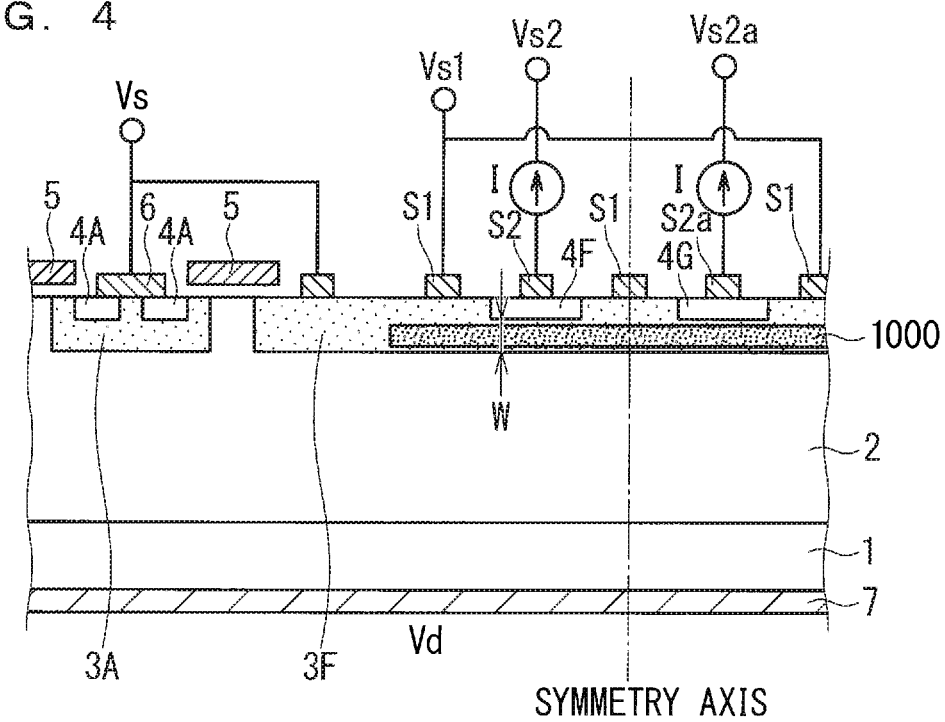

FIG. 4 is a schematic sectional view of a configuration of the semiconductor device according to the present preferred embodiment.

As shown in FIG. 4 as an example, the semiconductor device includes: the $n^+$ type semiconductor substrate 1; the $n^-$ type semiconductor layer 2; the p type impurity region 3A; a p type impurity region 3F partially formed in the surface layer of the $n^-$ type semiconductor layer 2 and having the defect region 1000; the plurality of $n^+$ type semiconductor regions 4A; an $n^+$ type semiconductor region 4F partially formed in the surface layer of the p type impurity region 3F; an $n^+$ type semiconductor region 4G partially formed in the surface layer of the p type impurity region 3F; the gate electrode 5; the source electrode 6; and the drain electrode 7.

An electrode formed in contact with a plurality of locations (three locations as seen in FIG. 4) of an upper surface of the p type impurity region 3F is the sense electrode S1, and an electrode formed in contact with an upper surface of the $n^+$ type semiconductor region 4F is the sense electrode S2. An electrode formed in contact with an upper surface of the $n^+$ type semiconductor region 4G is the sense electrode S2*a*.

The potential of the drain electrode 7 is the potential Vd, and the potential of the source electrode 6 is the potential Vs. The potential of the sense electrode S1 is the sense potential Vs1, and the potential of the sense electrode S2 is the sense potential Vs2. The potential of the sense electrode S2*a* is the sense potential Vs2*a*.

In the semiconductor device according to the present preferred embodiment, part of a structure including the p type impurity region 3F which is the voltage sense structure is short-circuited to the source electrode 6. The sense electrode S1 is provided in the vicinity of the $n^+$ type semiconductor region 4F and in the vicinity of the $n^+$ type semiconductor region 4G. Ideally, it is desirable that the sense electrode S1 is configured to surround the sense electrode S2 on the upper surface of the $n^+$ type semiconductor region 4F and the sense electrode S2*a* on the upper surface of the $n^+$ type semiconductor region 4G as seen in plan view.

In the semiconductor device according to the present preferred embodiment, the displacement current flowing in the p type impurity region 3F in the voltage sense structure is all bypassed by the sense electrode S1. Thus, the sense potential Vs1 minus the potential Vs is influenced by the displacement current, but the influence upon the sense potential Vs1 minus the sense potential Vs2 and the influence upon the sense potential Vs1 minus the sense potential Vs2*a* are greatly reduced.

As in the case illustrated in the third preferred embodiment, the voltages resulting from the displacement currents are canceled out. This greatly reduces the influence of fluctuations in potential Vd.

In the case of the semiconductor device according to the present preferred embodiment, the following relationship holds.

$$nkT/q \cdot \ln(Ia/I) \propto Vs2 - Vs2a \qquad (5)$$

Fifth Preferred Embodiment

The semiconductor device according to a fifth preferred embodiment will be described. In the following description, components similar to those described in the aforementioned preferred embodiments are designated by and shown using the same reference numerals and characters, and will not be described in detail, as appropriate.

Configuration of Semiconductor Device

FIG. 5 is a schematic sectional view of a configuration of the semiconductor device according to the present preferred embodiment.

As shown in FIG. 5 as an example, the semiconductor device includes: the $n^+$ type semiconductor substrate 1; the $n^-$ type semiconductor layer 2; the p type impurity region 3A; a p type impurity region 3H partially formed in the surface layer of the $n^-$ type semiconductor layer 2 and having the defect region 1000; a p type impurity region 3I partially formed in the surface layer of the $n^-$ type semiconductor layer 2 and having another defect region 1000; the plurality of n+ type semiconductor regions 4A; an n+ type semiconductor region 4H partially formed in the surface layer of the p type impurity region 3H; an n+ type semiconductor region 4I partially formed in the surface layer of the p type impurity region 3I; the gate electrode 5; the source electrode 6; and the drain electrode 7.

An electrode formed in contact with an upper surface of the p type impurity region 3H is the sense electrode S1, and an electrode formed in contact with an upper surface of the n+ type semiconductor region 4I is the sense electrode S2.

The potential of the drain electrode 7 is the potential Vd, and the potential of the source electrode 6 is the potential Vs. The potential of the sense electrode S1 is the sense potential Vs1, and the potential of the sense electrode S2 is the sense potential Vs2.

The n+ type semiconductor region 4H is connected to the p type impurity region 3I.

The pn junctions in the two voltage sense structures are electrically superimposed. That is, the voltage sense structures are electrically connected in series. Thus, the output voltage of the sense potential Vs1 minus the sense potential Vs2 is approximately doubled. The number of voltage sense structures connected to each other is not limited to two as illustrated in FIG. 5. By electrically superimposing the pn junctions in m voltage sense structures, an output voltage increased by a factor of m is obtained.

In the semiconductor device according to the present preferred embodiment, the output voltage is adjustable in accordance with the design of circuitry which receives the sense potential Vs1 minus the sense potential Vs2.

In the semiconductor device according to the present preferred embodiment, it is also desirable that a short circuit is caused between the potential Vs and the sense potential Vs1. However, the potential of an intermediate one of the p impurity regions in a multiplicity of pn junctions connected in series is not directly fixed. Thus, desirable is the voltage sense at the time when the potential Vd is stable, with the semiconductor device in an on or off state.

The influence of fluctuations in potential Vd is suppressed by employing the symmetrical arrangement illustrated in the third preferred embodiment and further detecting a voltage that is a difference. Also, voltage sense accuracy is increased if the accuracy of the current ratio is higher than that of the current values themselves.

Sixth Preferred Embodiment

The semiconductor device according to a sixth preferred embodiment will be described. In the following description, components similar to those described in the aforementioned preferred embodiments are designated by and shown using the same reference numerals and characters, and will not be described in detail, as appropriate.

Configuration of Semiconductor Device

FIG. 6 is a schematic sectional view of a configuration of the semiconductor device according to the present preferred embodiment.

As shown in FIG. 6 as an example, the semiconductor device includes: the n+ type semiconductor substrate 1; the n− type semiconductor layer 2; the p type impurity region 3A; a p type impurity region 3J partially formed in the surface layer of the n− type semiconductor layer 2 and having the defect region 1000; the plurality of n+ type semiconductor regions 4A; an n+ type semiconductor region 4J partially formed in the surface layer of the p type impurity region 3J; an n+ type semiconductor region 4K partially formed in the surface layer of the p type impurity region 3J; a gate electrode 5A in contact with the upper surface of the p type impurity region 3A lying between the n− type semiconductor layer 2 and the n+ type semiconductor regions 4A, with an oxide film (not shown in FIG. 6) therebetween; the source electrode 6; and the drain electrode 7.

The gate electrode 5A is also in contact with an upper surface of the p type impurity region 3J lying between the n type semiconductor layer 2 and the n+ type semiconductor region 4J, with an oxide film (not shown in FIG. 6) therebetween.

The width of the upper surface of the p type impurity region 3A lying between the n− type semiconductor layer 2 and the n+ type semiconductor regions 4A (i.e., the width where a channel is formed) is less than the width of the upper surface of the p type impurity region 3J lying between the n type semiconductor layer 2 and the n+ type semiconductor region 4J (i.e., the width where a channel is formed).

An electrode formed in contact with the upper surface of the p type impurity region 3J and an upper surface of the n+ type semiconductor regions 4J is the sense electrode S1, and an electrode formed in contact with an upper surface of the n+ type semiconductor region 4K is the sense electrode S2.

The potential of the drain electrode 7 is the potential Vd, and the potential of the source electrode 6 is the potential Vs. The potential of the sense electrode S1 is the sense potential Vs1, and the potential of the sense electrode S2 is the sense potential Vs2.

In the aforementioned configuration, the potential Vs minus the sense potential Vs2 is measured while a constant current is supplied by utilizing the current saturation properties of a MOSFET having a relatively wide channel of the upper surface of the p type impurity region 3J.

In the semiconductor device according to the present preferred embodiment, a constant voltage source used for the voltage sense is hence mounted on the semiconductor chip.

In this case, a short circuit cannot be caused between the potential Vs and the sense potential Vs1. Thus, desirable is the voltage sense at the time when the potential Vd is stable, with the semiconductor device in an on or off state.

Seventh Preferred Embodiment

The semiconductor device according to a seventh preferred embodiment will be described. In the following description, components similar to those described in the aforementioned preferred embodiments are designated by and shown using the same reference numerals and characters, and will not be described in detail, as appropriate.

Configuration of Semiconductor Device

Figure 7:
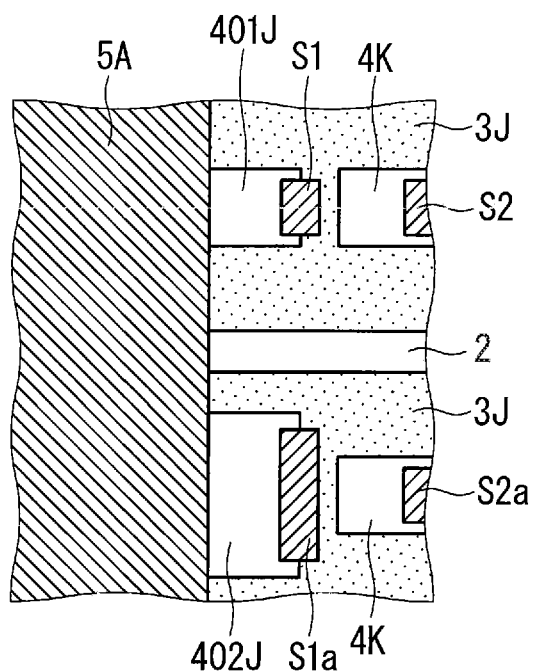
FIG. 7 is a schematic plan view of a configuration of the semiconductor device according to another preferred embodiment.

FIG. 7 is a schematic plan view of a configuration of the semiconductor device according to the present preferred embodiment. It should be noted that the sectional view of this configuration is similar to that of the sixth preferred embodiment shown in FIG. 6.

As shown in FIG. 7 as an example, the semiconductor device includes: a plurality of p type impurity regions 3J partially formed in the surface layer of then type semiconductor layer 2; an n+ type semiconductor region 401J partially formed in the surface layer of one of the p type impurity regions 3J; an n+ type semiconductor region 402J partially formed in the surface layer of the other of the p type impurity regions 3J; the n+ type semiconductor region 4K partially formed in the surface layer of each of the p type impurity regions 3J; and the gate electrode 5A in contact with an upper surface of one of the p type impurity regions 3J lying between the n⁺ type semiconductor layer 2 and the n⁺ type semiconductor regions 401J and an upper surface of the other of the p type impurity regions 3J lying between the n⁻ type semiconductor layer 2 and the n⁺ type semiconductor regions 402J, with an oxide film (not shown in FIG. 7) therebetween. The gate electrode 5A is formed so as to extend over the two p type impurity regions 3J.

The width of the n⁺ type semiconductor regions 401J which intersects a channel direction is less than the width of the n⁺ type semiconductor regions 402J which intersects the channel direction.

An electrode formed in contact with the upper surface of one of the p type impurity regions 3J and an upper surface of the n⁺ type semiconductor regions 401J is the sense electrode S1, and an electrode formed in contact with the upper surface of the other of the p type impurity regions 3J and an upper surface of the n⁺ type semiconductor region 402J is the sense electrode S1a. Electrodes formed in contact with the upper surface of the n⁺ type semiconductor region 4K are the sense electrodes S2 and S2a.

At least two MOSFETs having relatively wide channels in the upper surface of the p type impurity regions 3J are mounted in the semiconductor device according to the present preferred embodiment. These two MOSFETs axe disposed in substantially axisymmetric relation to each other with respect to a symmetry axis along to the channel direction.

The ratio between the widths of the channels formed in the upper surface of the p type impurity regions 3J is equal to the ratio between the currents flowing in the two MOSFETs.

On the other hand, the displacement current resulting from the fluctuations in the potential Vd is substantially dependent on the shape of the p type impurity regions 3J. Thus, the p type impurity regions 3J where the two MOSFETs are formed shall be identical in shape with each other in the semiconductor device according to the present preferred embodiment.

Assuming that the ratio between the currents flowing in the two MOSFETs is Ia/I, a situation satisfying Expression (4) discussed in the third preferred embodiment is achieved. This greatly reduces the influence of the fluctuation in potential Vd in the process of voltage sense.

The semiconductor device according to the present preferred embodiment utilizes only the ratio between the currents flowing in the two MOSFETs. It is hence not essential that the width of the channel formed in the upper surface of the p type impurity regions 3J is greater than the width of the channel formed in the upper surface of the p type impurity region 3A.

Also, voltage sense accuracy is increased if the accuracy of the current ratio is higher than that of the current values themselves.

In the semiconductor device according to the present preferred embodiment, a short circuit cannot be caused between the potential Vs and the sense potential Vs1. Thus, desirable is the voltage sense at the time when the potential Vd is stable, with the semiconductor device in an on or off state.

Eighth Preferred Embodiment

The semiconductor device according to an eighth preferred embodiment will be described. In the following description, components similar to those described in the aforementioned preferred embodiments are designated by and shown using the same reference numerals and characters, and will not be described in detail, as appropriate.

Configuration of Semiconductor Device

Figure 8:
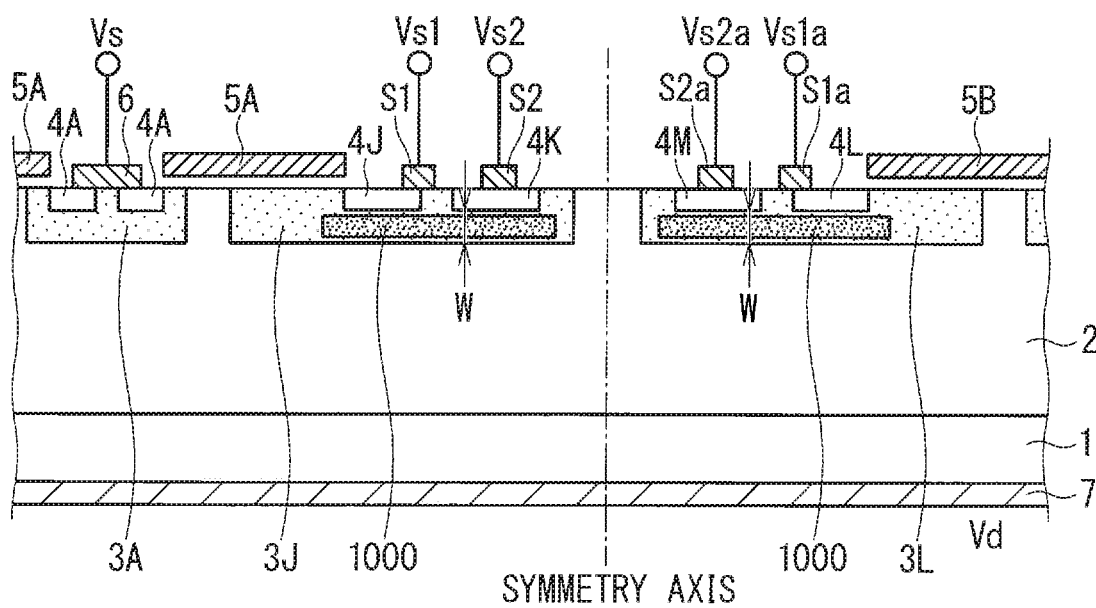
FIGS. 8 and 9 are schematic sectional views of configurations of the semiconductor device according to other preferred embodiments.

FIG. 8 is a schematic sectional view of a configuration of the semiconductor device according to the present preferred embodiment.

As shown in FIG. 8 as an example, the semiconductor device includes: the n⁺ type semiconductor substrate 1; the n⁺ type semiconductor layer 2; the p type impurity region 3A; the p type impurity region 3J; the plurality of n⁺ type semiconductor regions 4A; the n⁺ type semiconductor region 4J; the n⁺ type semiconductor region 4K; the gate electrode 5A; a p type impurity region 3L partially formed in the surface layer of the n⁻ type semiconductor layer 2 and having the defect region 1000; an n⁺ type semiconductor region 4L partially formed in the surface layer of the p type impurity region 3L; an n⁺ type semiconductor region 4M partially formed in the surface layer of the p type impurity region 3L; a gate electrode 5B in contact with an upper surface of the p type impurity region 3L lying between the n⁻ type semiconductor layer 2 and the n⁺ type semiconductor region 4L, with an oxide film (not shown in FIG. 8) therebetween; the source electrode 6; and the drain electrode 7.

An electrode formed in contact with the upper surface of the p type impurity region 3J and the upper surface of the n⁺ type semiconductor region 4J is the sense electrode S1, and an electrode formed in contact with the upper surface of the n⁺ type semiconductor region 4K is the sense electrode S2.

An electrode formed in contact with the upper surface of the p type impurity region 3L and an upper surface of the n⁺ type semiconductor region 4L is the sense electrode S1a, and an electrode formed in contact with an upper surface of the n⁺ type semiconductor region 4M is the sense electrode S2a.

The potential of the drain electrode 7 is the potential Vd, and the potential of the source electrode 6 is the potential Vs. The potential of the sense electrode S1 is the sense potential Vs1, and the potential of the sense electrode S1a is the sense potential Vs1a. The potential of the sense electrode S2 is the sense potential Vs2, and the potential of the sense electrode S2a is the sense potential Vs2a.

A voltage sense structure including the p type impurity region 3J and a voltage sense structure including the p type impurity region 3L are disposed in axisymmetric relation to each other with respect to a symmetry axis.

The semiconductor device according to the present preferred embodiment is not capable of canceling fluctuations in channel length due to mask misalignment. However, if the channel length is sufficiently large, there is a likelihood that the aforementioned symmetrical arrangement has an advantage in terms of fluctuations.

The semiconductor device according to the present preferred embodiment may include two MOSFETs arranged in a direction perpendicular to the plane of the figure, as illustrated in the seventh preferred embodiment.

Ninth Preferred Embodiment

The semiconductor device according to a ninth preferred embodiment will be described. In the following description, components similar to those described in the aforementioned preferred embodiments are designated by and shown using the same reference numerals and characters, and will not be described in detail, as appropriate.

In the semiconductor device discussed in the aforementioned preferred embodiments, a drain voltage decreases when a voltage is applied to the gate electrode to turn on the semiconductor device. Then, the drain voltage decreases to an on-state voltage substantially conforming to static current-voltage characteristics.

If the voltage measurement is made in this state, fluctuations in drain potential is extremely small. This greatly improves the voltage sense accuracy.

Tenth Preferred Embodiment

The semiconductor device according to a tenth preferred embodiment will be described. In the following description, components similar to those described in the aforementioned preferred embodiments are designated by and shown using the same reference numerals and characters, and will not be described in detail, as appropriate.

Configuration of Semiconductor Device

Figure 9:
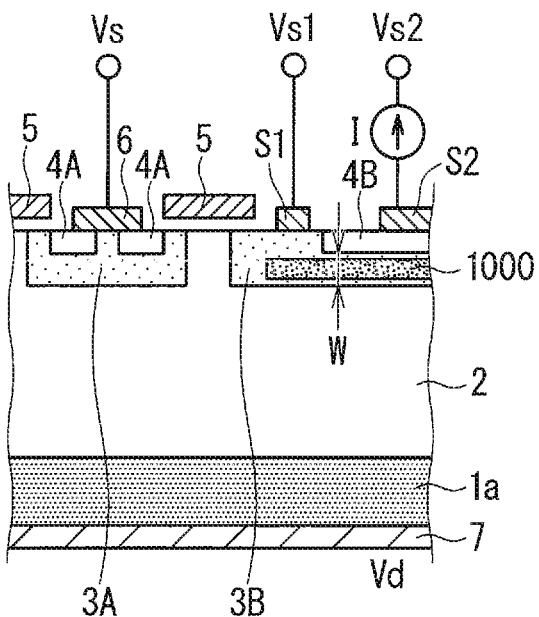

FIG. 9 is a schematic plan view of a configuration of the semiconductor device according to the present preferred embodiment. The configuration shown in FIG. 9 is an insulated gate bipolar transistor (IGBT).

As shown in FIG. 9 as an example, the semiconductor device includes: a $p^+$ type semiconductor substrate 1a; the $n^-$ type semiconductor layer 2 formed on an upper surface of the $p^+$ type semiconductor substrate 1a; the p type impurity region 3A; the p type impurity region 3B; the plurality of $n^+$ type semiconductor regions 4A; the $n^+$ type semiconductor region 4B; the gate electrode 5; the source electrode 6 (i.e., an emitter electrode); and the drain electrode 7 (i.e., a collector electrode) formed in contact with a lower surface of the $p^+$ type semiconductor substrate 1a.

An electrode formed in contact with the upper surface of the p type impurity region 3B is the sense electrode S1, and an electrode formed in contact with the upper surface of the $n^+$ type semiconductor region 4B is the sense electrode S2.

The potential of the drain electrode 7 is the potential Vd, and the potential of the source electrode 6 is the potential Vs. The potential of the sense electrode S1 is the sense potential Vs1, and the potential of the sense electrode S2 is the sense potential Vs2.

In the semiconductor device according to the present preferred embodiment which is the IGBT, holes flow from the drain electrode 7 into the p type impurity region 3B. However, the influence of the current flowing in the p type impurity region 3B is suppressed as discussed in the first preferred embodiment. Thus, although the IGBT, the semiconductor device according to the present preferred embodiment is capable of producing effects similar to those of the first preferred embodiment.

The configurations in the second, third, fourth, fifth, sixth, seventh, eighth, and ninth preferred embodiments may be applied to the IGBT to produce similar effects.

Effects Produced by Aforementioned Preferred Embodiments

Next, examples of the effects produced by the aforementioned preferred embodiments will be described. In the following description, the effects will be described based on specific configurations illustrated as examples in the aforementioned preferred embodiments. However, the specific configurations may be replaced with other specific configurations illustrated as examples in the present disclosure so long as similar effects are produced.

The replacement may be performed over at least two of the preferred embodiments. That is, the configurations illustrated as examples in different ones of the preferred embodiments may be combined together to produce similar effects.

According to the aforementioned preferred embodiments, the semiconductor device includes: a semiconductor layer of a first conductivity type (n type); a first impurity region of a second conductivity type (p type); a p type second impurity region; an n type first semiconductor region; an n type second semiconductor region; a first electrode; a second electrode; a third electrode; and the gate electrode 5 (or the gate electrode 5A). The n type semiconductor layer corresponds to the $n^-$ type semiconductor layer 2, for example. The p type first impurity region corresponds to the p type impurity region 3A, for example. The p type second impurity region corresponds to at least one of the p type impurity region 3B, the p type impurity region 3C, the p type impurity region 3D, the p type impurity region 3E, the p type impurity region 3F, the p type impurity region 3H, the p type impurity region 3I, the p type impurity region(s) 3J, and the p type impurity region 3L, for example. The n type first semiconductor region corresponds to the $n^+$ type semiconductor regions 4A, for example. The n type second semiconductor region corresponds to at least one of the $n^+$ type semiconductor region 4B, the $n^+$ type semiconductor region 4C, the $n^+$ type semiconductor region 4D, the $n^+$ type semiconductor region 4E, the $n^+$ type semiconductor region 4F, the $n^+$ type semiconductor region 4G, the $n^+$ type semiconductor region 4H, the $n^+$ type semiconductor region 4I, the $n^+$ type semiconductor region 4J, the $n^+$ type semiconductor region 4K, the $n^+$ type semiconductor region 4L, and the $n^+$ type semiconductor region 4M, for example. The first electrode corresponds to the source electrode 6, for example. The second electrode corresponds to at least one of the sense electrode S1 and the sense electrode S1a, for example. The third electrode corresponds to at least one of the sense electrode S2 and the sense electrode S2a, for example. The p type impurity region 3A is partially formed in the surface layer of the $n^-$ type semiconductor layer 2. The p type impurity region 3B is partially formed in the surface layer of the $n^-$ type semiconductor layer 2. The p type impurity region 3B is spaced apart from the p type impurity region 3A. The $n^+$ type semiconductor regions 4A are partially formed in the surface layer of the p type impurity region 3A. The $n^+$ type semiconductor region 4B is partially formed in the surface layer of the p type impurity region 3B. The source electrode 6 is formed in contact with the upper surface of the p type impurity region 3A and the upper surface of the $n^+$ type semiconductor regions 4A. The sense electrode S1 is formed in contact with the upper surface of the p type impurity region 3B. The sense electrode S2 is formed in contact with the upper surface of the $n^+$ type semiconductor region 4B. The gate electrode 5 is provided on the upper surface of the p type impurity region 3A lying between the $n^-$ type semiconductor layer 2 and the $n^+$ type semiconductor regions 4A, with an insulation film therebetween. The p type impurity region 3B includes the defect region 1000 provided at least under the $n^+$ type semiconductor region 4B and having a defect density higher than that in the surface layer of the p type impurity region 3B.

Such a configuration lowers the lifetime of electrons in the p type impurity region 3B and especially in the defect region 1000 to thereby suppress the operation of a parasitic transistor. This suppresses the decrease in the accuracy of measurement of temperature and the like based on the sense potentials.

Similar effects are produced when at least one of the other configurations illustrated as examples in the present disclosure is added as appropriate to the configuration described above, that is, when the other configurations illustrated as examples in the present disclosure but not referred to as the aforementioned configuration are added as appropriate.

According to the aforementioned preferred embodiments, at least one of the following expressions is satisfied in the defect region 1000.

$$Ic/Ie \leq 1/1000 \quad (6)$$

$$W \geq 7\sqrt{(D_n \tau_n)} \quad (7)$$

where Ic is the forward bias current in the pn junction between the $n^+$ type semiconductor region 4B and the p type impurity region 3B; Ie is the current flowing out from the p type impurity region 3B into the $n^-$ type semiconductor layer 2; W is the thickness of the defect region 1000; $D_n$ is the diffusion coefficient of electrons in the p type impurity region 3B; and $\tau_n$ is the lifetime of the electrons in the p type impurity region 3B.

In such a configuration, the electron concentration resulting from the electrons injected into the p type impurity region 3B decreases exponentially and becomes nearly zero when the distance W is traveled. This lowers the lifetime of the electrons in the p type impurity region 3B and especially in the defect region 1000.

In the aforementioned preferred embodiments, the source electrode 6 is electrically connected to the p type impurity region 3C (or the p type impurity region 3F). In such a configuration, the displacement current flowing in the p type impurity region 3C in the voltage sense structure is all bypassed by the sense electrode S1. This greatly reduces the influence upon the sense potential Vs1 minus the sense potential Vs2.

In the aforementioned preferred embodiments, the sense electrode S1 is disposed to surround the sense electrode S2 as seen in plan view. In such a configuration, the displacement current flowing in the p type impurity region 3C in the voltage sense structure is all bypassed by the sense electrode S1. This greatly reduces the influence upon the sense potential Vs1 minus the sense potential Vs2.

In the aforementioned preferred embodiments, the semiconductor device includes a plurality of voltage sense structures when a structure including the p type impurity region 3D (or the p type impurity region 3E), the $n^+$ type semiconductor region 4D (or the $n^+$ type semiconductor region 4E), the sense electrode S1 (or the sense electrode S1a), and the sense electrode S2 (or the sense electrode S2a) is defined as a voltage sense structure. In such a configuration, the voltage sense accuracy is increased by the use of the current ratio if the accuracy of the current ratio is higher than that of the current values themselves.

In the aforementioned preferred embodiments, the p type impurity region 3D (and the p type impurity region 3E), the $n^+$ type semiconductor region 4D (and the $n^+$ type semiconductor region 4E), the sense electrode S1 (and the sense electrode S1a), and the sense electrode S2 (and the sense electrode S2a) in the plurality of voltage sense structures are disposed in axisymmetric relation to each other. In such a configuration, the displacement currents generated in the two respective voltage sense structures disposed in symmetric relation to each other substantially coincide with each other. The voltage developed by the displacement current flowing to the resistance of the p type impurity region 3D substantially coincides with the voltage developed by the displacement current flowing to the resistance of the p type impurity region 3E. Thus, the voltages resulting from the displacement currents are canceled out. This greatly reduces the influence of fluctuations in potential Vd.

In the aforementioned preferred embodiments, the voltage sense structures are electrically connected in series. In such a configuration, the output voltage is adjustable in accordance with the design of circuitry which receives the sense potential Vs1 minus the sense potential Vs2.

In the aforementioned preferred embodiments, the gate electrode 5A is also provided on the upper surface of the p type impurity region 3J lying between the $n^-$ type semiconductor layer 2 and the $n^+$ type semiconductor region 4J, with an insulation film therebetween. In such a configuration, a constant voltage source used for the voltage sense is mounted on the semiconductor chip.

In the aforementioned preferred embodiments, the width of the upper surface of the p type impurity regions 3J lying between the $n^-$ type semiconductor layer 2 and the $n^+$ type semiconductor region 4J is greater than the width of the upper surface of the p type impurity region 3A lying between the $n^-$ type semiconductor layer 2 and the $n^+$ type semiconductor regions 4A. In such a configuration, the potential Vs minus the sense potential Vs2 is measured while a stable constant current is supplied by utilizing the current saturation properties of the MOSFET having a relatively wide channel of the upper surface of the p type impurity region 3J.

In the aforementioned preferred embodiments, the plurality of p type impurity regions 3J are formed. The gate electrode 5A is formed so as to extend over the plurality of p type impurity regions 3J. In such a configuration, a constant voltage source used for the voltage sense is mounted on the semiconductor chip. Also, the voltage sense accuracy is increased by the use of the current ratio if the accuracy of the current ratio is higher than that of the current values themselves.

In the aforementioned preferred embodiments, a voltage between the sense electrode S1 and the sense electrode S2 is measured when the semiconductor device is fixed in the on or off state by the voltage applied to the gate electrode 5A. Such a configuration makes the fluctuations in drain potential (potential Vd) extremely small to greatly improve the voltage sense accuracy.

In the aforementioned preferred embodiments, the semiconductor device includes: the $p^+$ type semiconductor substrate 1a formed on a lower surface of the $n^-$ type semiconductor layer 2; and a fourth electrode formed on the lower surface of the $p^+$ type semiconductor substrate 1a. The fourth electrode corresponds to the drain electrode 7, for example. Although the IGBT, such a configuration is capable of lowering the lifetime of electrons in the p type impurity region 3B and especially in the defect region 1000 to suppress the operation of a parasitic transistor. This suppresses the decrease in the accuracy of measurement of temperature and the like based on the sense potentials.

In a method of manufacturing the semiconductor device according to the aforementioned preferred embodiments, the p type impurity region 3A is partially formed in the surface layer of the $n^-$ type semiconductor layer 2. Then, the p type impurity region 3B is partially formed in the surface layer of the $n^-$ type semiconductor layer 2 so as to be positioned in spaced apart relation to the p type impurity region 3A. Then, electron beam irradiation, proton irradiation, helium irradiation, or the like is applied to a bottom portion of the p type impurity region 3B to form the defect region 1000 having a defect density higher than that in the surface layer of the p type impurity region 3B. Then, the n+ type semiconductor regions 4A of the first conductivity type are partially formed in the surface layer of the p type impurity region 3A. Then, the n+ type semiconductor region 4B of the first conductivity type is partially formed in the surface layer of the p type impurity region 3B. Then, the source electrode 6 in contact with the upper surface of the p type impurity region 3A and the upper surface of the n+ type semiconductor regions 4A is formed. Then, the sense electrode S1 in contact with the upper surface of the p type impurity region 3B is formed. Then, the sense electrode S2 in contact with the upper surface of the n+ type semiconductor region 4B is formed. Then, the gate electrode 5 is formed on the upper surface of the p type impurity region 3A lying between the n− type semiconductor layer 2 and the n+ type semiconductor regions 4A, with the insulation film therebetween.

Such a configuration allows the defect region 1000 to be formed in the bottom portion of the p type impurity region 3B. This lowers the lifetime of electrons in the p type impurity region 3B and especially in the defect region 1000 to thereby suppress the operation of a parasitic transistor.

Similar effects are produced when at least one of the other configurations illustrated as examples in the present disclosure is added as appropriate to the configuration described above, that is, when the other configurations illustrated as examples in the present disclosure but not referred to as the aforementioned configuration are added as appropriate.

Unless limited otherwise, the order in which the processes are performed may be changed.

Modifications of Aforementioned Preferred Embodiments

The material properties, materials, dimensions, shapes, and relative positional relationship of the components or conditions for implementation are described in some cases in the aforementioned preferred embodiments. These are, however, merely examples in all aspects and shall not be limited to those described in the present disclosure.

Thus, numerous unillustrative modifications and equivalents can be devised within the technical scope disclosed in the present disclosure. Examples of these shall include an instance where at least one component is modified, added or dispensed with and an instance where at least one component in at least one preferred embodiment is extracted and combined with a component in another preferred embodiment.

So long as no inconsistencies arise, "one" component described in the aforementioned preferred embodiments may include "not less than one" component.

Further, each of the components in the aforementioned preferred embodiments is a conceptual unit. An instance where a component includes a plurality of structures, an instance where a component corresponds to part of a structure, and an instance where components are provided in one structure shall be included in the technical scope disclosed in the present disclosure.

Also, each of the components in the aforementioned preferred embodiments shall include structures having other configurations or shapes, so long as the same function is performed.

The description given in the present disclosure is referred to for all purposes associated with the present technique and is not recognized as background art.

When referred to without being particularly specified in the aforementioned preferred embodiments, a material shall contain another additive, e.g. an alloy, so long as no inconsistencies arise.

While the disclosure has been described in detail, the foregoing description is in all aspects illustrative and not restrictive. It is understood that numerous other modifications and variations can be devised without departing from the scope of the disclosure.

What is claimed is:

1. A semiconductor device comprising:
   a semiconductor layer of a first conductivity type;
   a first impurity region of a second conductivity type partially formed in a surface layer of the semiconductor layer;
   at least one second impurity region of the second conductivity type partially formed in the surface layer of the semiconductor layer and spaced apart from the first impurity region;
   a first semiconductor region of the first conductivity type partially formed in a surface layer of the first impurity region;
   a second semiconductor region of the first conductivity type partially formed in a surface layer of the second impurity region;
   a first electrode formed in contact with an upper surface of the first impurity region and an upper surface of the first semiconductor region;
   a second electrode formed in contact with an upper surface of the second impurity region;
   a third electrode formed in contact with an upper surface of the second semiconductor region; and
   a gate electrode provided on the upper surface of the first impurity region lying between the semiconductor layer and the first semiconductor region, with an insulation film therebetween, such that the second electrode is between the gate electrode and the second semiconductor region and spaced from the gate electrode and the second semiconductor region,
   the second impurity region including a low lifetime region at at least a bottom portion of the second semiconductor region, the low lifetime region being a region having a defect density higher than that in the surface layer of the second impurity region or a region in which a heavy metal is diffused.

2. The semiconductor device according to claim 1, wherein satisfied in the low lifetime region is at least one of the following expressions:

$$Ic/Ie \leq 1/1000$$

$$W \geq 7\sqrt{(D_n \tau_n)}$$

where Ic is a forward bias current in a pn junction between the second semiconductor region and the second impurity region; Ie is a current flowing out from the second impurity region into the semiconductor layer; W is the thickness of the low lifetime region; $D_n$ is a diffusion coefficient of electrons in the second impurity region; and $\tau_n$ is the lifetime of the electrons in the second impurity region.

3. A semiconductor device comprising:
   a semiconductor layer of a first conductivity type;
   a first impurity region of a second conductivity type partially formed in a surface layer of the semiconductor layer;

at least one second impurity region of the second conductivity type partially formed in the surface layer of the semiconductor layer and spaced apart from the first impurity region;
a first semiconductor region of the first conductivity type partially formed in a surface layer of the first impurity region;
a second semiconductor region of the first conductivity type partially formed in a surface layer of the second impurity region;
a first electrode formed in contact with an upper surface of the first impurity region and an upper surface of the first semiconductor region;
a second electrode formed in contact with an upper surface of the second impurity region;
a third electrode formed in contact with an upper surface of the second semiconductor region; and
a gate electrode provided on the upper surface of the first impurity region lying between the semiconductor layer and the first semiconductor region, with an insulation film therebetween,
the second impurity region including a low lifetime region at at least a bottom portion of the second semiconductor region, the low lifetime region being a region having a defect density higher than that in the surface layer of the second impurity region or a region in which a heavy metal is diffused, and
wherein the first electrode is electrically connected to the second impurity region.

4. The semiconductor device according to claim 1, wherein the second electrode is disposed so as to surround the third electrode as seen in plan view.

5. The semiconductor device according to claim 1, further comprising
a plurality of voltage sense structures,
each of the voltage sense structures including the second impurity region, the second semiconductor region, the second electrode, and the third electrode.

6. The semiconductor device according to claim 5, wherein the second impurity regions, the second semiconductor regions, the second electrodes, and the third electrodes in the voltage sense structures are disposed in axisymmetric relation to each other.

7. The semiconductor device according to claim 5, wherein the voltage sense structures are electrically connected in series.

8. A semiconductor device comprising:
a semiconductor layer of a first conductivity type;
a first impurity region of a second conductivity type partially formed in a surface layer of the semiconductor layer;
at least one second impurity region of the second conductivity type partially formed in the surface layer of the semiconductor layer and spaced apart from the first impurity region;
a first semiconductor region of the first conductivity type partially formed in a surface layer of the first impurity region;
a second semiconductor region of the first conductivity type partially formed in a surface layer of the second impurity region;
a first electrode formed in contact with an upper surface of the first impurity region and an upper surface of the first semiconductor region;
a second electrode formed in contact with an upper surface of the second impurity region and in contact with the second semiconductor region;
a third electrode formed in contact with an upper surface of the second semiconductor region; and
a gate electrode provided on the upper surface of the first impurity region lying between the semiconductor layer and the first semiconductor region, with an insulation film therebetween,
the second impurity region including a low lifetime region at at least a bottom portion of the second semiconductor region, the low lifetime region being a region having a defect density higher than that in the surface layer of the second impurity region or a region in which a heavy metal is diffused, and
wherein the gate electrode is provided also on the upper surface of the second impurity region lying between the semiconductor layer and the second semiconductor region, with an insulation film therebetween, and a portion of the second semiconductor region being between the gate electrode and the second electrode.

9. The semiconductor device according to claim 8, wherein the upper surface of the second impurity region lying between the semiconductor layer and the second semiconductor region has a width greater than that of the upper surface of the first impurity region lying between the semiconductor layer and the first semiconductor region.

10. The semiconductor device according to claim 8, wherein the at least one second impurity region includes a plurality of second impurity regions, and wherein the gate electrode is formed so as to extend over the second impurity regions.

11. The semiconductor device according to claim 1, wherein a voltage between the second electrode and the third electrode is measured when the semiconductor device is fixed in an on or off state by a voltage applied to the gate electrode.

12. The semiconductor device according to claim 1, further comprising:
a semiconductor substrate of the second conductivity type formed on a lower surface of the semiconductor layer; and
a fourth electrode formed on a lower surface of the semiconductor substrate.

13. A method of manufacturing a semiconductor device, comprising the steps of:
partially forming a first impurity region of a second conductivity type in a surface layer of a semiconductor layer of a first conductivity type;
partially forming a second impurity region of the second conductivity type in the surface layer of the semiconductor layer so as to be positioned in spaced apart relation to the first impurity region;
applying electron beam irradiation, proton irradiation, or helium irradiation to at least a bottom portion of the second impurity region or diffusing a heavy metal therein to form a low lifetime region, the low lifetime region being a region having a defect density higher than that in a surface layer of the second impurity region or a region in which the heavy metal is diffused;
partially forming a first semiconductor region of the first conductivity type in a surface layer of the first impurity region;
partially forming a second semiconductor region of the first conductivity type in the surface layer of the second impurity region;
forming a first electrode in contact with an upper surface of the first impurity region and an upper surface of the first semiconductor region;

forming a second electrode in contact with an upper surface of the second impurity region;
forming a third electrode in contact with an upper surface of the second semiconductor region; and
forming a gate electrode on the upper surface of the first impurity region lying between the semiconductor layer and the first semiconductor region, with an insulation film therebetween, such that the second electrode is between the gate electrode and the second semiconductor region and spaced from the gate electrode and the second semiconductor region.

* * * * *